United States Patent [19]

Schlotzhauer

[11] Patent Number: 4,528,517
[45] Date of Patent: Jul. 9, 1985

[54] OVERDRIVE THERMAL DISTORTION COMPENSATION FOR A QUINN CASCOMP AMPLIFIER

[75] Inventor: Kenneth G. Schlotzhauer, Beaverton, Oreg.

[73] Assignee: Tektronix, Inc., Beaverton, Oreg.

[21] Appl. No.: 464,795

[22] Filed: Feb. 7, 1983

[51] Int. Cl.³ .......................... H03F 3/45; H03F 1/30
[52] U.S. Cl. .................................. 330/256; 330/151; 330/311; 330/258
[58] Field of Search ............... 330/151, 256, 258, 260, 330/261, 311

[56] References Cited

U.S. PATENT DOCUMENTS 3,938,055 2/1976 Buhler .................................. 330/258
4,322,688 3/1982 Schlotzhauer .................. 330/311 X

OTHER PUBLICATIONS

Buhler, O. R., "Differential Amplifier", IBM Tech. Disclosure Bull., vol. 13, No. 12, May 1971.
Temkin, Bruce M., "A Low Level Amplifier for Precision Multiplexing", Int'l Telemetering Conf., L.A., CA, USA, 9/28–30/76.

Primary Examiner—James B. Mullins
Attorney, Agent, or Firm—George T. Noe

[57] ABSTRACT

The cascomp amplifier is modified to provide a dynamic biasing circuit which varies the bias point of the cascomp amplifier in proportion to the change in the true bias point of the main channel pair to allow full thermal $V_{be}$ error correction for overdrive conditions and for common-mode signals. A buffer amplifier senses the average voltage of the main channel input transistor emitters and generates a voltage proportional to this average which is added to the biasing network for the cascomp amplifier common-base amplifier transistors.

1 Claim, 1 Drawing Figure

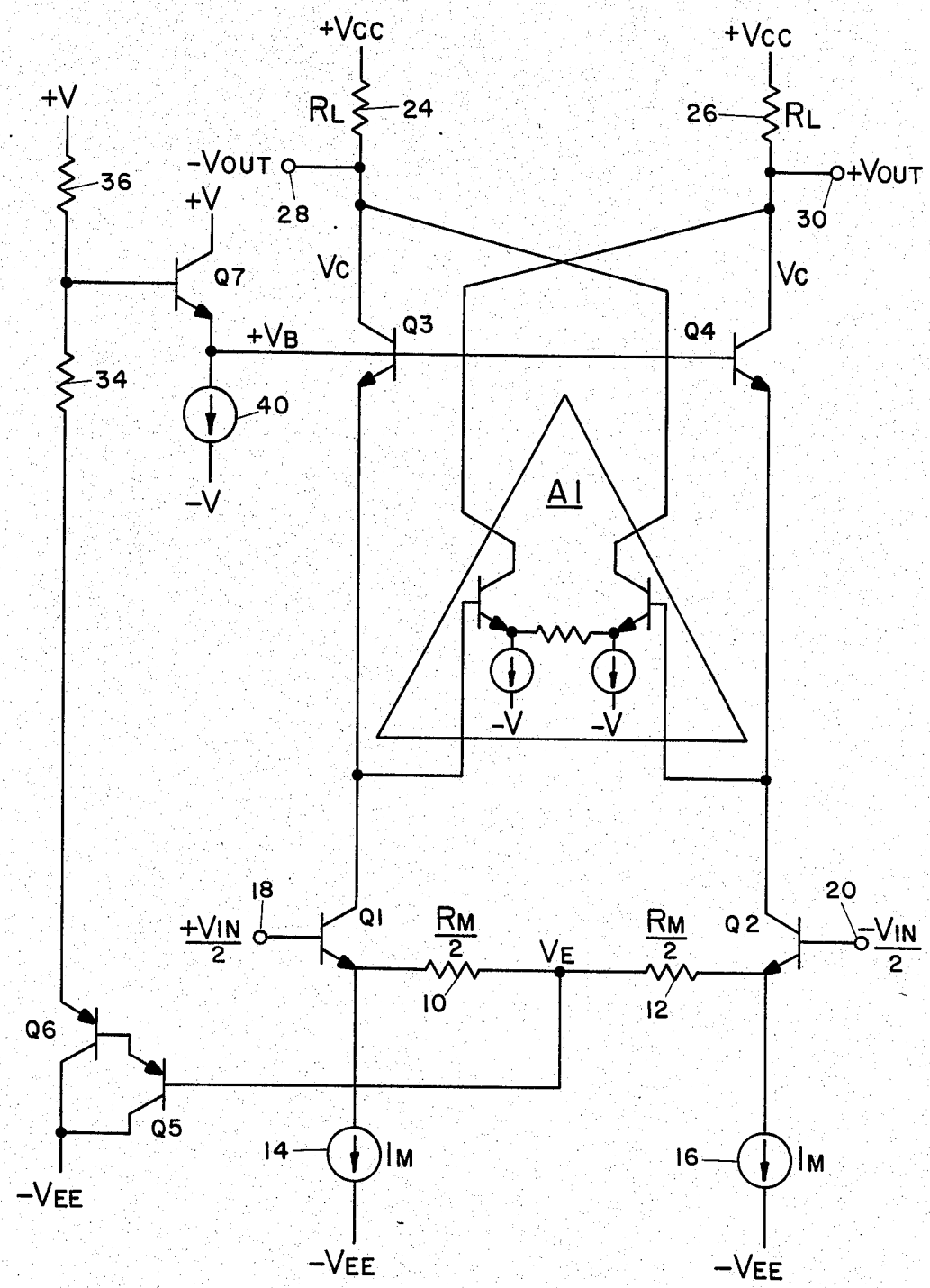

OVERDRIVE THERMAL DISTORTION COMPENSATION FOR A QUINN CASCOMP AMPLIFIER

BACKGROUND OF THE INVENTION

This invention relates generally to high-precision wideband amplifiers, and more particularly to an overdrive thermal compensation mechanism for a cascode feed-forward amplifier.

The cascode feed-forward amplifier taught by Quinn in U.S. Pat. No. 4,146,844 and gaining rapid commercial acceptance as the Quinn "cascomp" amplifier provides vastly improved performance over previous amplifier designs. The Quinn cascomp amplifier employs a correction channel which senses pn junction distortion of a main channel and injects an error-correction signal into a pair of output nodes. The cascomp amplifier when properly biased will compensate for thermal junction-voltage ($V_{be}$) in the main channel input devices when presented with a pure differential signal, but cannot maintain this compensation when overdriven, or presented with signals having a common-mode component.

SUMMARY OF THE INVENTION

In accordance with the present invention, a dynamic biasing circuit varies the bias point of the cascomp amplifier in proportion to the change in the true bias point of the main channel input pair to allow full thermal $V_{be}$ error correction for overdrive conditions and common-mode signals. The biasing circuit comprises a buffer amplifier which senses the average of the main channel input transistor emitter voltages and generates a voltage proportional to this average which is added to the biasing network for the cascomp amplifier common-base amplifier transistors, thereby changing the bias of the common-base stage in proportion to the average of the input stage emitter voltages.

It is therefore one object of the present invention to provide a dynamic biasing circuit for a cascomp amplifier which results in overdrive thermal distortion compensation.

It is another object of the present invention to provide a circuit for dynamically varying the bias point of a cascomp amplifier in proportion to the change in the true bias point of the main channel input differentially-connected transistors with signal so as to retain thermal $V_{be}$ error correction under all conditions of input signal including overdrive conditions and common-mode signal application.

Other objects and advantages of the present invention will become apparent to those skilled in the art upon a reading of the following description when taken in conjunction with the accompanying drawing.

BRIEF DESCRIPTION OF THE DRAWING

This single FIGURE is a schematic diagram of the preferred embodiment in accordance with the present invention.

DETAILED DESCRIPTION OF THE PREFERRED EMBODIMENT

In this single FIGURE, a cascomp amplifier is shown in which a main amplifier channel comprises four transistors, Q1, Q2, Q3, and Q4, and a correction channel comprises an amplifier A1. The emitters of transistors Q1 and Q2 are coupled together through a pair of equal-valued resistors 10 and 12 connected in series, and are further connected to a suitable source of negative voltage $-V_{EE}$ through respective constant current sinks 14 and 16. The bases of transistors Q1 and Q2 are coupled respectively to input terminals 18 and 20 to which respective input signals $+$ and $-V_{IN}/2$ are applied. Transistors Q1 and Q2 are operated as a transconductance amplifier in that they convert the input signal into a current signal equal to $V_{IN}/R_M$.

Transistors Q3 and Q4 form a common-base amplifier stage. The bases of transistors Q3 and Q4 are coupled together to a source of bias voltage $+V_B$, to be discussed later. The collectors of transistors Q3 and Q4 are coupled to a suitable source of collector supply voltage $+V_{CC}$ through load resistors 24 and 26, respectively, and the emitters thereof are connected to the collectors of transistors Q1 and Q2, respectively. Output terminals 28 and 30 are connected to the collectors of transistors Q3 and Q4, respectively.

The correction amplifier A1, which may suitably be a differential amplifier as shown, has a pair of inputs connected respectively to the emitters of transistors Q3 and Q4, and a pair of collectors cross coupled to the collectors of transistors Q4 and Q3, respectively. Operation of the correction amplifier A1 in the cascomp amplifier context is fully disclosed by Patrick A. Quinn in U.S. Pat. No. 4,146,844.

A buffer amplifier comprising transistors Q5 and Q6 is connected such that the base of transistor Q5 is connected to the junction of resistors 10 and 12 to receive an average voltage $V_E$ developed between the emitters of transistors Q1 and Q2. Transistors Q5 and Q6 are operated as an emitter-follower buffer amplifier to apply the voltage signal $V_E$ to one end of a voltage divider comprising resistors 34 and 36 serially connected between the emitter of transistor Q6 and a suitable supply voltage $+V$. The junction of resistors 34 and 36 is connected to the base of emitter-follower transistor Q7, the collector of which is connected to the supply voltage $+V$ and the emitter of which, where bias voltage $+V_B$ is produced, is connected to a supply voltage $-V$ through a constant current sink 40 as well as being connected to the bases of transistors Q3 and Q4. Thus the bias voltage $+V_B$ varies in proportion to the average voltage $V_E$ developed between the emitters of transistors Q1 and Q2.

Thermal $V_{be}$ error correction of transistors Q1 and Q2 occurs in the cascomp amplifier if the power dissipation $P_{dQ3(Q4)} = P_{dQ1(Q2)}$. Now power dissipation $P_{dQ3(Q4)}$ is proportional to $V_{CC} - V_B - I_M R_L + V_{beQ3(Q4) \, quiescent}$ and power dissipation $P_{dQ1(Q2)}$ is proportional to $V_B - V_E - I_M R_M$. Therefore, $V_B = (V_{CC} - I_M(R_M - R_M) + V_{beQ3(Q4) \, quiescent})/2 + V_E/2$. For a pure differential signal $V_{IN}$, if $V_{IN} \leq I_M R_M$, then $V_E$ is constant. But for $V_{IN} > I_M R_M$, Q2 will cut off, allowing the average voltage $V_E$ to rise, which violates the foregoing condition. If the attenuation ratio of divider 34–36 is made equal to 0.5 and bias voltage $$+V_B = \frac{V_{CC} - I_M(R_L - R_M) + V_{beQ3(Q4)quiescent}}{2} + \frac{V_E}{2}$$

thermal $V_{be}$ error correction of transistors Q1 and Q2 will be maintained under all input signal conditions, including overdrive and common-mode drive. Thus, the bias point of the cascomp amplifier dynamically varies in proportion to the change in the true bias point of the input differential amplifier Q1–Q2 with signal so as to retain proper tnermal $V_{be}$ error correction of transistors Q1 and Q2 under all conditions of input signal.

The basic cascomp analysis assumes equal transistor sizes for transistors Q1, Q2, Q3, and Q4, a common thermal environment such as may be attained in an integrated circuit, and a purely differential input signal. Overdrive and/or common-mode signals disrupt the power dissipation balance, and thus the dynamic bias circuit of the present invention senses the actual bias point at the emitters of transistors Q1 and Q2 and adjusts the bias voltage $+V_B$ to maintain common-mode thermal distortion correction.

While I have shown and described a preferred embodiment of my invention, it will become apparent to those having skill in the art that many changes may be made without departing from my invention in its broader aspects. The appended claims therefore cover all such changes and modifications as fall therewithin.

What I claim as being novel is:

1. A cascomp amplifier, comprising:
   a main amplifier comprising an emitter-coupled pair of transistors for converting an input signal to a differential signal current;
   a common-base amplifier stage coupled to said main amplifier, said common-base amplifier stage comprising a pair of transistors through which said differential signal current passes;
   a correction amplifier having a pair of inputs coupled between said main amplifier and said common-base amplifier stage, and a pair of outputs cross-coupled in a current-aiding sense with the outputs of said common-base amplifier;
   a buffer amplifier having an input connected to the junction of a pair of equal-valued resistors coupled between the emitters of said emitter-coupled pair of transistors in said main amplifier to sense the average voltage value therebetween;
   voltage divider means for receiving said average voltage value and producing a proportional voltage value of said average voltage value; and
   an emitter-follower stage having an input coupled to said voltage divider means and an output coupled to the bases of said pair of transistors comprising said common-base amplifier stage.

* * * * *